United States Patent
Wang et al.

(10) Patent No.: US 10,418,343 B2
(45) Date of Patent: Sep. 17, 2019

(54) PACKAGE-IN-PACKAGE STRUCTURE FOR SEMICONDUCTOR DEVICES AND METHODS OF MANUFACTURE

(71) Applicant: Infineon Technologies AG, Neubiberg (DE)

(72) Inventors: Hui Teng Wang, Johor (MY); Swain Hong Yeo, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/832,336

(22) Filed: Dec. 5, 2017

(65) Prior Publication Data

US 2019/0172815 A1 Jun. 6, 2019

(51) Int. Cl.
*H01L 25/065* (2006.01)
*H01L 23/495* (2006.01)
(Continued)

(52) U.S. Cl.
CPC ...... *H01L 25/0657* (2013.01); *H01L 21/4825* (2013.01); *H01L 21/561* (2013.01); *H01L 21/565* (2013.01); *H01L 21/568* (2013.01); *H01L 21/78* (2013.01); *H01L 23/3107* (2013.01); *H01L 23/367* (2013.01); *H01L 23/49503* (2013.01); *H01L 23/49537* (2013.01); *H01L 23/49555* (2013.01);
(Continued)

(58) Field of Classification Search
CPC ......... H01L 23/49537; H01L 23/49575; H01L 23/49555; H01L 2225/0651; H01L 23/49503–49513; H01L 25/043; H01L 25/0657; H01L 25/074; H01L 25/0756; H01L 25/117; H01L 21/565; H01L 23/3107
See application file for complete search history.

(56) References Cited

U.S. PATENT DOCUMENTS 7,271,496 B2 9/2007 Kim
7,298,037 B2 11/2007 Yim et al.
(Continued)

FOREIGN PATENT DOCUMENTS

CN 205845941 U 12/2016

OTHER PUBLICATIONS

"Assembly and Packaging", International Technology Roadmap for Semiconductors, 2005 Edition.
(Continued)

*Primary Examiner* — Syed I Gheyas
(74) *Attorney, Agent, or Firm* — Murphy, Bilak & Homiller, PLLC (57) ABSTRACT

A semiconductor package includes a second leadframe assembly stacked above a first leadframe assembly, each leadframe assembly including a die pad, a plurality of leads and a semiconductor die attached to the die pad and electrically connected to the leads. A spacer separates the leadframe assemblies from one another. A single mold compound embeds part of the first leadframe assembly, part of the second leadframe assembly and the spacer. A portion of the leads of both leadframe assemblies are uncovered by the mold compound to form terminals of the semiconductor package. A side of both die pads is uncovered by the mold compound.

12 Claims, 12 Drawing Sheets

(51) Int. Cl.

| | | |
|---|---|---|
| *H01L 23/31* | (2006.01) | |
| *H01L 23/367* | (2006.01) | |
| *H01L 25/00* | (2006.01) | |
| *H01L 21/78* | (2006.01) | |
| *H01L 21/56* | (2006.01) | |
| *H01L 21/48* | (2006.01) | |
| *H01L 23/00* | (2006.01) | |

(52) U.S. Cl.
CPC .. *H01L 23/49568* (2013.01); *H01L 23/49575* (2013.01); *H01L 24/97* (2013.01); *H01L 25/0652* (2013.01); *H01L 25/50* (2013.01); H01L 24/48 (2013.01); H01L 2224/48106 (2013.01); H01L 2224/48247 (2013.01); *H01L 2225/0651* (2013.01); *H01L 2225/06575* (2013.01); *H01L 2225/06589* (2013.01)

(56) References Cited

U.S. PATENT DOCUMENTS

| | | |
|---|---|---|
| 7,687,897 B2 | 3/2010 | Ha et al. |
| 7,714,416 B2 | 5/2010 | Bauer et al. |
| 7,745,918 B1 | 6/2010 | Woodyard |
| 7,923,846 B2 | 4/2011 | Do et al. |
| 7,977,779 B2 | 7/2011 | Camacho et al. |
| 7,982,298 B1 | 7/2011 | Kang et al. |
| 8,299,608 B2 | 10/2012 | Bartley et al. |
| 8,664,755 B2 | 3/2014 | Lim et al. |
| 8,729,687 B2 | 5/2014 | Lee et al. |
| 9,589,928 B2 | 3/2017 | Bai et al. |
| 2006/0082021 A1* | 4/2006 | Williams ............ H01L 21/4842 264/272.17 |
| 2006/0197210 A1* | 9/2006 | Kim ...................... H01L 21/565 257/686 |
| 2007/0080437 A1* | 4/2007 | Marimuthu ........... H01L 21/561 257/676 |
| 2008/0142957 A1 | 6/2008 | Wang et al. |
| 2008/0303130 A1* | 12/2008 | Chen ..................... H01L 25/105 257/686 |
| 2011/0248411 A1 | 10/2011 | Ho et al. |
| 2013/0320514 A1 | 12/2013 | Romig et al. |
| 2015/0262981 A1* | 9/2015 | Yap ....................... H01L 25/165 361/760 |

OTHER PUBLICATIONS

Johnson, R. Wayne et al., "3-D Packaging: A Technology Review", Auburn University, Jun. 23, 2005.

* cited by examiner

PACKAGE-IN-PACKAGE STRUCTURE FOR SEMICONDUCTOR DEVICES AND METHODS OF MANUFACTURE

TECHNICAL FIELD

The present application relates to semiconductor device packaging, and particularly to stacked assemblies for packaging semiconductor devices.

BACKGROUND

Stacking is a technique by which multiple semiconductor dies (chips) or multiple semiconductor packages are stacked on one another to reduce the overall package footprint and size. In the case of chip-on-chip stacking technology, two semiconductor dies are attached to one another in a stacked arrangement with bond wire connections to the dies. The stacked chip arrangement with wire bond connections is then molded to form the final package. However, with the chip-on-chip stacking approach, both dies are fully encapsulated by the mold compound, limiting the thermal performance of the final solution. Also, dedicated wire bond design rules are required to form the bond wire connections to the stacked die arrangement. In the case of package-on-package stacking technology, two fully completed semiconductor packages are stacked on one another. That is, each semiconductor package has been molded, trimmed and formed prior to stacking. The finished packages are then glued to one another in a stacked arrangement. However, with the package-on-package stacking approach, both packages are fully molded and the dies are embedded entirely within the respective mold compounds, again limiting the thermal performance of the final solution.

Hence, there is a need for improved stacked assemblies for packaging semiconductor devices.

SUMMARY

According to an embodiment of a semiconductor package, the semiconductor package comprises a first leadframe assembly and a second leadframe assembly stacked above the first leadframe assembly. The first leadframe assembly comprises a first die pad, a first plurality of leads, and a first semiconductor die attached to the first die pad and electrically connected to the first plurality of leads. The second leadframe assembly comprises a second die pad, a second plurality of leads, and a second semiconductor die attached to the second die pad and electrically connected to the second plurality of leads. A spacer separates the first and the second leadframe assemblies from one another. A single mold compound embeds part of the first leadframe assembly, part of the second leadframe assembly and the spacer. A portion of the first plurality of leads and a portion of the second plurality of leads are uncovered by the mold compound to form terminals of the semiconductor package. A side of the first die pad facing away from the first semiconductor die and a side of the second die pad facing away from the second semiconductor die are uncovered by the mold compound.

According to an embodiment of a method of manufacturing semiconductor packages, the method comprises: providing a plurality of first leadframe assemblies each of which includes a first die pad, a first plurality of leads, and a first semiconductor die attached to the first die pad and electrically connected to the first plurality of leads; stacking a second leadframe assembly above each of the first leadframe assemblies, each second leadframe assembly comprising a second die pad, a second plurality of leads, and a second semiconductor die attached to the second die pad and electrically connected to the second plurality of leads; providing a spacer between the first second leadframe assemblies and the second leadframe assemblies; embedding part of each first leadframe assembly, part of each second leadframe assembly and each spacer in a single mold compound, so that a portion of each first plurality of leads and a portion of each second plurality of leads are uncovered by the mold compound to form terminals of respective semiconductor packages, and so that a side of each first die pad facing away from the adjacent first semiconductor die and a side of each second die pad facing away from the adjacent second semiconductor die are uncovered by the mold compound; and singulating the respective semiconductor packages into individual packages.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide a package-in-package structure that leverages the benefits of both chip-on-chip and package-on-package stacking technologies. The package-in-package structure is realized by stacking two leadframe assemblies on one another, each leadframe assembly having a die pad, leads and at least one semiconductor die attached to the die pad and electrically connected to the leads. A spacer separates the leadframe assemblies from one another, to prevent bond wire shorting between the stacked leadframe assemblies. The spacer and part of the leadframe assemblies are then embedded in a single mold compound via a common molding process. The die pads of the leadframe assemblies are uncovered by the mold compound at opposite sides of the final package, to provide double-sided heat dissipation. In addition to improved thermal management, the package-in-package structure provides higher component density, does not require design rule changes for chip-to-packaging interconnection (die attach and wire bond), reduces the complexity associated with 3D semiconductor packaging, combines two typical IC packaging end-of-line processes such as molding, de-flashing, lead plating, etc. into a single process with less material usage, utilizes a carrier that eliminates lead bouncing during wire bond, and enables package-level molding during the manufacturing process that can be re-used.

Figure 1A:
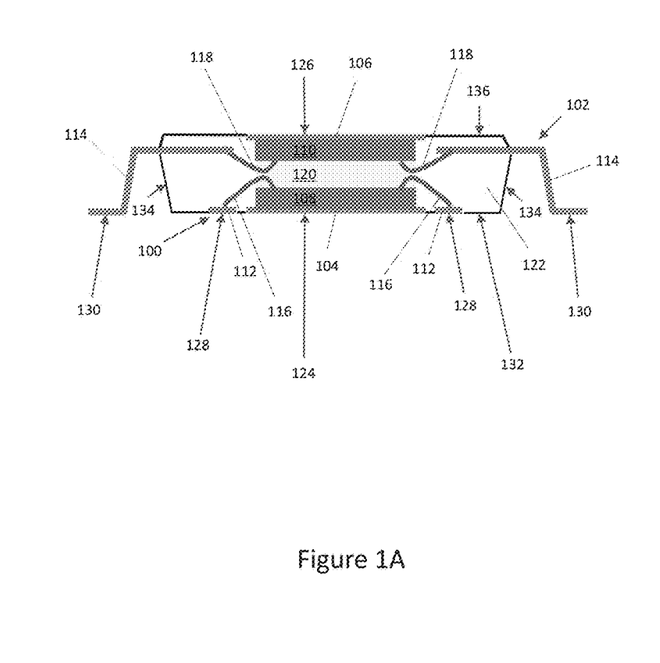
FIG. 1A illustrates a cross-sectional view of an embodiment of a molded semiconductor package having a package-in-package structure.
Figure 1B:
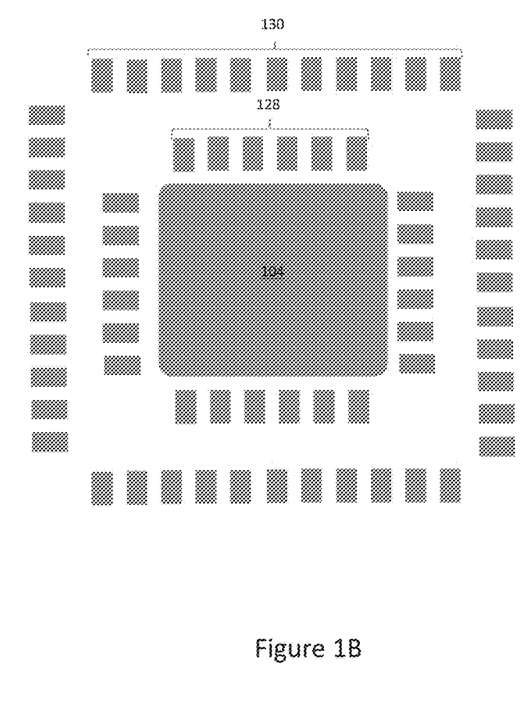
FIG. 1B illustrates a top plan view of the leadframe footprint at the bottom side of the molded semiconductor package.

FIG. 1A illustrates a cross-sectional view of an embodiment of a molded semiconductor package having a package-in-package structure, and FIG. 1B illustrates a top plan view of the leadframe footprint at the bottom side of the package.

The molded semiconductor package comprises a first leadframe assembly 100 and a second leadframe assembly 102 stacked above the first leadframe assembly 100. Each leadframe assembly 100, 102 includes a die pad 104, 106 for attaching at least one semiconductor die 108, 110, and leads 112, 114 providing means for external electrical connection to the respective dies 108, 110. Each die 108, 110 can be connected to the corresponding leads 112, 114 by wires 116, 118, e.g. through wire bonding or tape automated bonds. The semiconductor dies 108, 110 are attached to the respective die pads 104, 106 by a standard die attach material, and the wire bond connections 116, 118 are formed between the dies 108, 110 and the corresponding leads 112 114 to form the leadframe assemblies 100, 102.

Before the package is molded, the second leadframe assembly 102 is stacked above the first leadframe assembly 100. Also, a spacer 120 is provided for separating the leadframe assemblies 100, 102 from one another. In FIGS. 1A and 1B, the semiconductor die 110 of the second leadframe assembly 102 is disposed over and vertically aligned with the semiconductor die 108 of the first leadframe assembly 100. According to this embodiment, the spacer 120 separates the upper semiconductor die 110 from the lower semiconductor die 108. In the case of the dies 108, 110 being disposed one above the other but vertically misaligned or one die not being disposed over (i.e. not overlapping in the vertical direction with) the other, the spacer 120 is still provided as a structural support for facilitating the die stacking. In general, the spacer 120 is provided as structural support to enable die stacking prior to the molding process, and to ensure sufficient electrical isolation between the bond wire connections 116, 118 of the stacked leadframe assemblies 100, 102. This way, the subsequent molding process can be performed for embedding part of the first leadframe assembly 100, part of the second leadframe assembly 102 and the spacer 120.

The spacer 120 is electrically insulative for the reasons explained above. Preferably, but not necessarily, the spacer 120 is a good thermal conductor. Some examples of the spacer material are an adhesive or a polymeric glob, film or paste with thermally conductive and electrically insulative fillers. These are examples only, and should not be considered limiting.

With the second leadframe assembly 102 stacked above the first leadframe assembly 102 and the spacer 120 provided to separate the leadframe assemblies 100, 102 from one another, the arrangement is subjected to a common molding process during which part of the first leadframe assembly 100, part of the second leadframe assembly 102 and the spacer 120 are embedded in a single mold compound 122. That is, the same mold compound 122 integrally embeds part of the leadframe assemblies 100, 102 and also the spacer 120. Hence, two separately molded packages are not stacked one on the other to form the resulting package-in-package structure, and no physical mold compound interface is present between the two leadframe assemblies 100, 102. Instead, the package-in-package structure embodiments described herein use a single mold compound 122 which has a contiguous construction throughout to embed the spacer 120 and partly embed the leadframe assemblies 100, 102 via a common molding process. The spacer 120 may comprises the same or different material than the mold compound 122.

The side 124 of the die pad 104 of the first leadframe assembly 100 facing away from the semiconductor die 108 attached to that die pad 104 is uncovered by the mold compound 122. Similarly, the side 126 of the die pad 106 of the second leadframe assembly 102 facing away from the semiconductor die 110 attached to that die pad 106 also is uncovered by the mold compound 122. With this configuration, the molded semiconductor package provides double-sided heat dissipation.

A portion of the leads 112 of the first leadframe assembly 100 are uncovered by the mold compound 122 to form a first set of terminals 128 of the semiconductor package. Similarly, a portion of the leads 114 of the second leadframe assembly 102 are uncovered by the mold compound 122 to form a second set of terminals 130 of the semiconductor package. The terminals 128, 130 provide points of external electrical contact for the semiconductor dies 108, 110 embedded in the common mold compound 122.

The terminals 128, 130 formed by the leads 112, 114 of the leadframe assemblies 100, 102 can have different configurations. In this embodiment, the first set of terminals 128 is located within an outline of the molded semiconductor package and flush with a bottom face 132 of the molded semiconductor package. The second set of terminals 130 extends beyond the outline of the molded semiconductor package from one or more faces of the semiconductor package. According to a particular example, one of the leadframe assemblies 100/102 has a quad-flat no-leads (QFN) or a dual-flat no-leads (DFN) configuration and the other leadframe assembly 102/100 has a quad flat package (QFP) or a dual small outline package (DSO) configuration. Flat no-leads package configurations such as QFN and DFN connect an IC at the bottom to the surface of printed circuit board (PSB) or similar substrate without through-holes. QFP and DSO configurations are also surface mount technologies, but the terminals (leads) extend from one or more side faces of the package instead of the bottom surface.

In FIGS. 1A and 1B, the first leadframe assembly 100 has a QFN or DFN configuration and the second leadframe assembly 102 has a QFP or DSO configuration. The leads 112 of the first leadframe assembly 100 are uncovered by the mold compound 122 at the bottom face 132 of the molded semiconductor package. The leads 114 of the second leadframe assembly 102 protrude from the mold compound 122 at one or more side faces 134 of the semiconductor package and are bent in a direction toward the bottom face 132 of the package.

Figure 2:
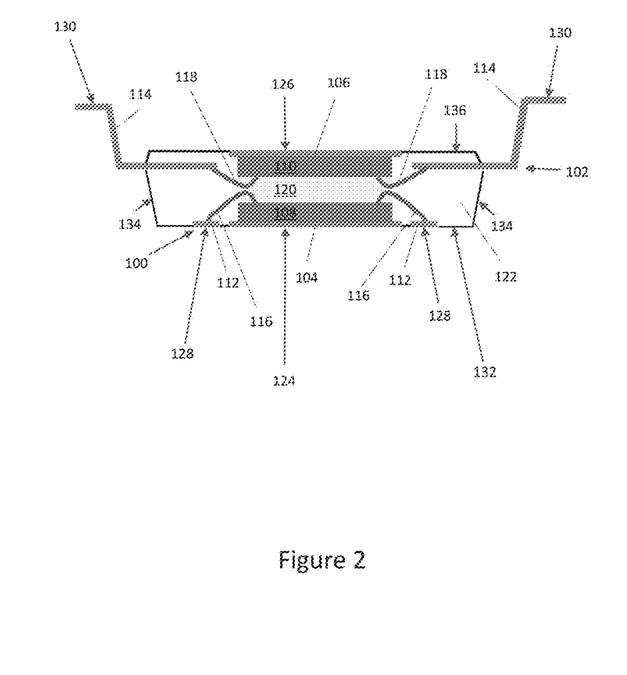
FIGS. 2 through 8 and 13 through 16 illustrate respective cross-sectional views of additional embodiments of a molded semiconductor package having a package-in-package structure.

FIG. 2 illustrates another embodiment of the first leadframe assembly 100 having a QFN or DFN configuration and the second leadframe assembly 102 having a QFP or DSO configuration. The embodiment illustrated in FIG. 2 is similar to the embodiment illustrated in FIGS. 1A and 1B. Different, however, the leads 114 of the second leadframe assembly 102 are bent in a direction toward the top face 136 of the semiconductor package opposite the bottom face 132.

Figure 3:
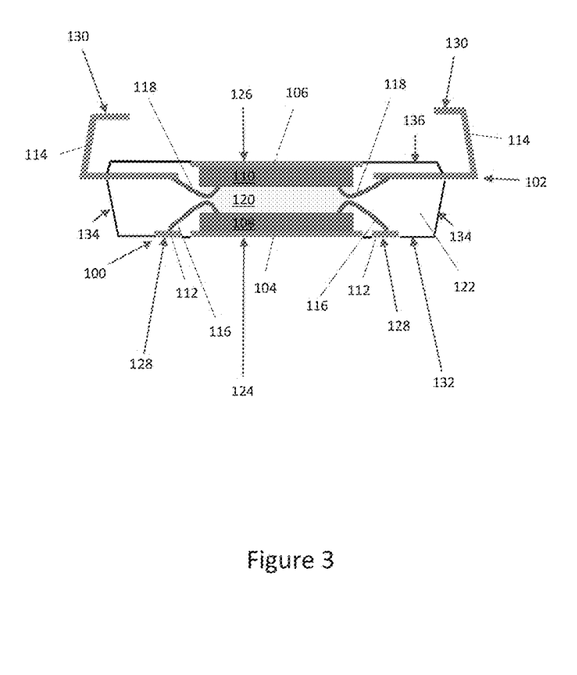

FIG. 3 illustrates yet another embodiment of the first leadframe assembly 100 having a QFN or DFN configuration and the second leadframe assembly 102 having a QFP or DSO configuration. The embodiment illustrated in FIG. 3 is similar to the embodiment illustrated in FIG. 2. Different, however, the ends of the leads 114 of the second leadframe assembly 102 point inward toward the package instead of outward.

Figure 4:
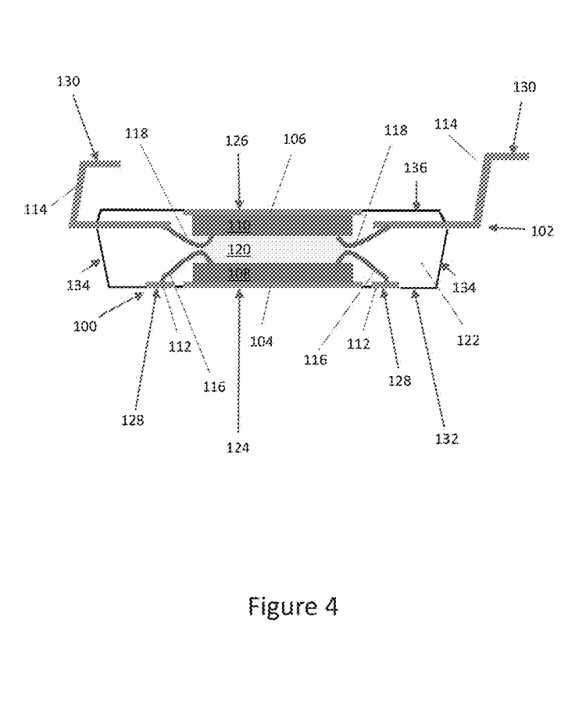

FIG. 4 illustrates still another embodiment of the first leadframe assembly 100 having a QFN or DFN configuration and the second leadframe assembly 102 having a QFP or DSO configuration. The embodiment illustrated in FIG. 4 is similar to the embodiment illustrated in FIG. 3. Different, however, the ends of some leads 114 of the second leadframe assembly 102 point inward toward the package and the ends of other leads 114 of the second leadframe assembly 102 point outward.

Figure 5:
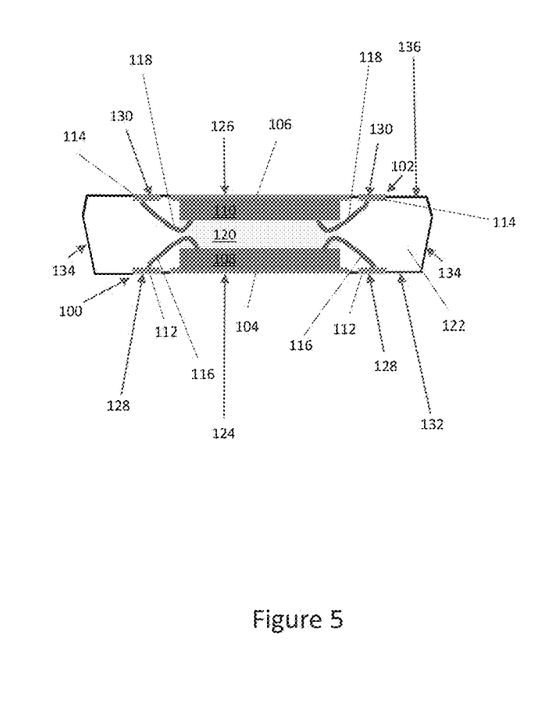

FIG. 5 illustrates an embodiment in which both leadframe assemblies 100, 102 have a QFN or DFN configuration. According to this embodiment, the leads 112 of the first leadframe assembly 100 are uncovered by the mold compound 122 at the bottom face 132 of the molded semiconductor package and the leads 114 of the second leadframe assembly 102 are uncovered by the same mold compound at the top face 136 of the package opposite the bottom face 132.

Figure 6:
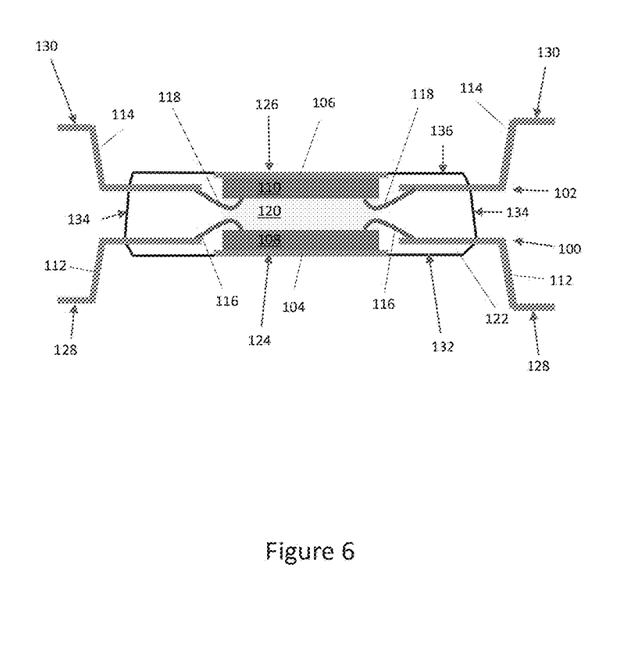

FIG. 6 illustrates an embodiment in which both leadframe assemblies 100, 102 have a QFP or DSO configuration. According to this embodiment, the leads 112 of the first leadframe assembly 100 protrude from the mold compound 122 at one or more side faces 134 of the molded semiconductor package and are bent in a direction toward the bottom face 132 of the package. The leads 114 of the second leadframe assembly 102 also protrude from the mold compound at the one or more side faces 134 of the semiconductor package, but are bent in a direction toward the top face 136 of the semiconductor package opposite the bottom face 132.

Figure 7:
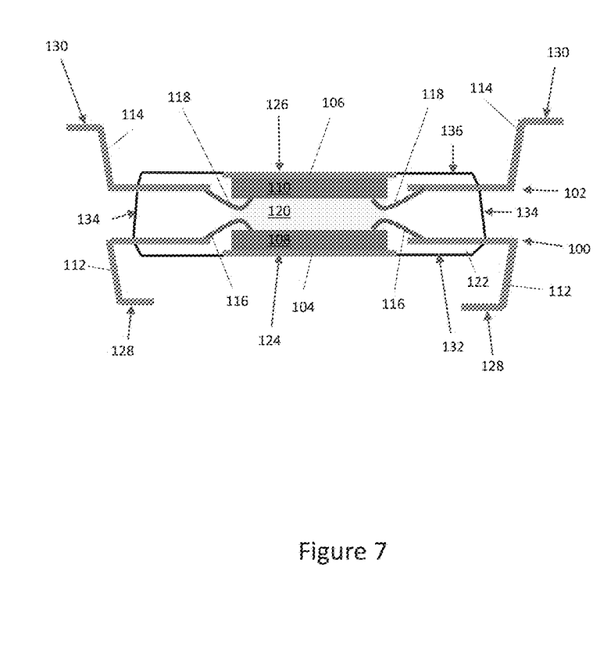

FIG. 7 illustrates another embodiment of both leadframe assemblies 100, 102 having a QFP or DSO configuration. The embodiment illustrated in FIG. 7 is similar to the embodiment illustrated in FIG. 6. Different, however, the ends of the leads 112 of the first leadframe assembly 100 point inward toward the molded semiconductor package instead of outward as shown in FIG. 6.

Figure 8:
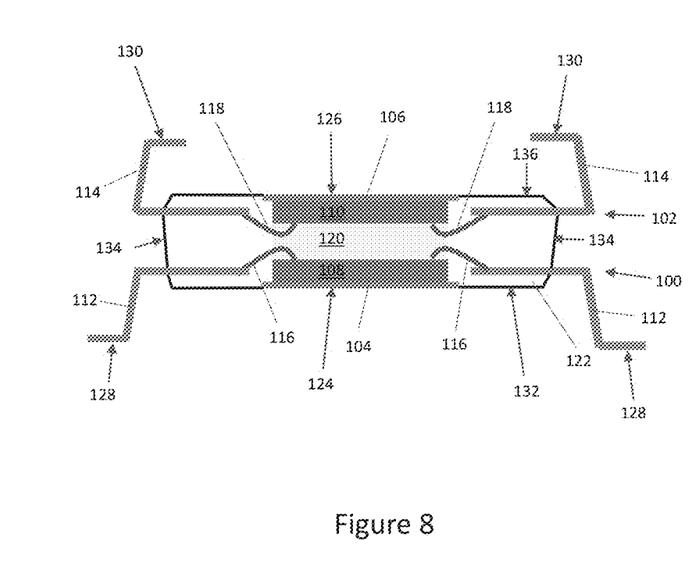

FIG. 8 illustrates yet another embodiment of both leadframe assemblies 100, 102 having a QFP or DSO configuration. The embodiment illustrated in FIG. 8 is similar to the embodiment illustrated in FIG. 6. Different, however, the ends of the leads 114 of the second leadframe assembly 102 point inward toward the molded semiconductor package instead of outward as shown in FIG. 6. Yet additional QFP terminal (lead) configurations are contemplated, and depend on the corresponding conductor track layout of the board/PCB to which the molded semiconductor package is to be attached.

As described previously herein, the molded semiconductor package is manufactured by stacking the second leadframe assembly 102 above the first leadframe assembly 100 and providing the spacer 120 for separating the leadframe assemblies 100, 102 from one another prior to a common molding process. After the leadframe assemblies 100, 102 are stacked and separated from one another by the spacer 120, part of the first leadframe assembly 100, part of the second leadframe assembly 102 and the spacer 120 are embedded in a single mold compound 122. Described next are specific embodiments of manufacturing the molded semiconductor package.

FIGS. 9A through 9D illustrate one embodiment of forming the first leadframe assembly 100 shown in FIGS. 1A and 1B.

Figure 9A:
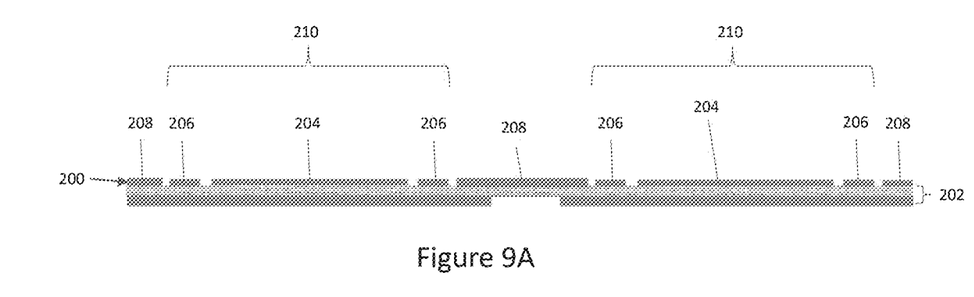
FIGS. 9A through 9D, 10A through 10C, and 11A through 11E illustrate an embodiment of a method of manufacturing the molded semiconductor package.

In FIG. 9A, a first leadframe strip 200 is provided with a carrier 202 temporarily attached to the bottom of the first leadframe strip 200. The carrier 202 provides support during the subsequent wire bond and common molding processes. The first leadframe strip 200 includes a plurality of first die pads 204 and a plurality of first leads 206 interconnected to one another by a frame 208. Each die pad 204 and the surrounding group of leads 206 forms an individual leadframe 210 which are interconnected by the frame 108 e.g. via so-called tie bars or similar structures. Leadframe strips are typically constructed from flat sheet metal, e.g. by stamping or etching. The sheet metal is typically exposed to chemical etchants that remove areas not covered by photoresist. After the etching process, the etched frames are singulated (separated) into lead frame strips. Each lead frame strip includes a number of unit lead frames each having the die pad and lead construction described herein.

Figures 9B, 9C:
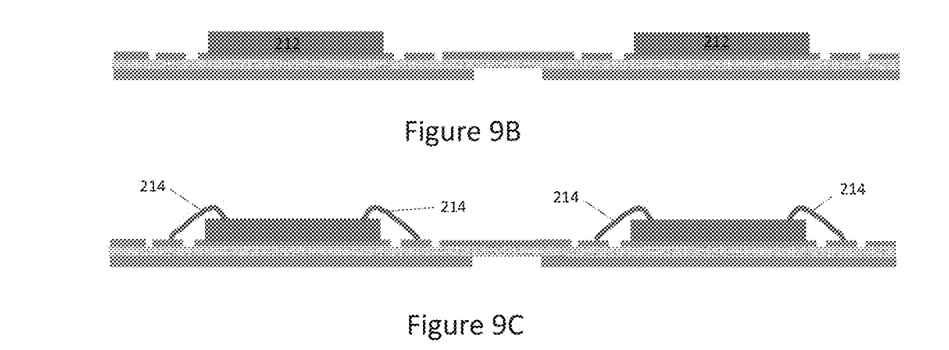

In FIG. 9B, a first semiconductor die 212 is attached to each one of the first die pads 204 of the first leadframe strip 200. Any standard die attach process can be used such as soldering, sintering, gluing, etc.

In FIG. 9C, each one of the first semiconductor dies 212 is electrically connected to the group of first leads 206 that surrounds the first die pad 204 to which the die 212 is attached. For example, the first dies 212 can be connected to the corresponding groups of first leads 206 by electrical conductors 214 such as wire bonds, metal clips, metal ribbons, etc.

Figure 9D:
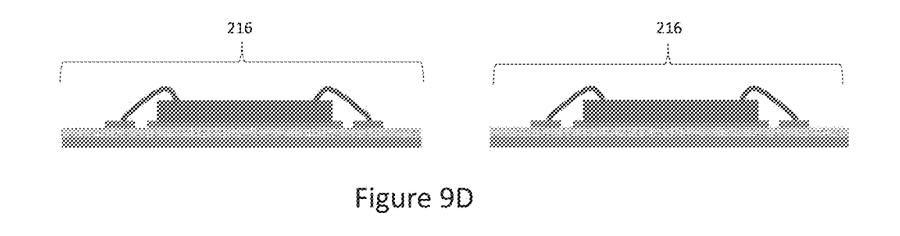

In FIG. 9D, the first leadframe strip 200 is singulated into individual first leadframe assemblies 216 by any standard singulation process such as laser cutting, jet stream cutting, sawing, etc. Although not shown in FIG. 9D, a spacer material can be applied to the exposed main surface of each first semiconductor die 212.

Figure 10A:
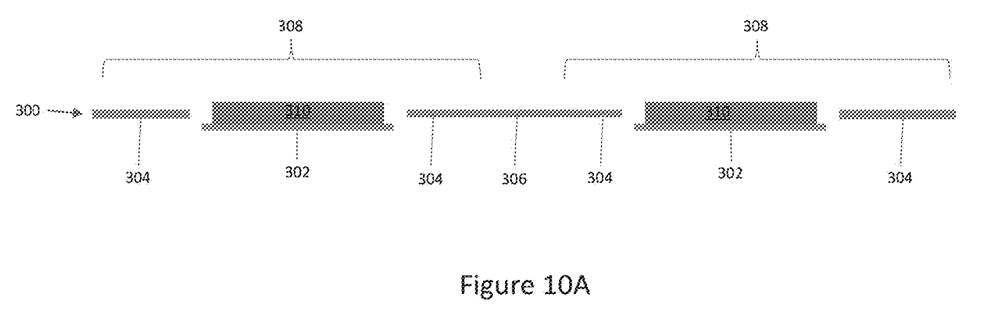
Figure 10B:
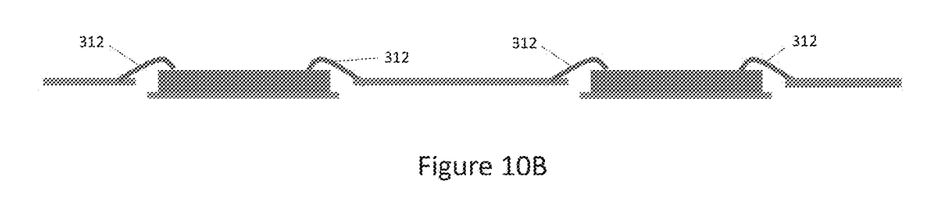
Figure 10C:
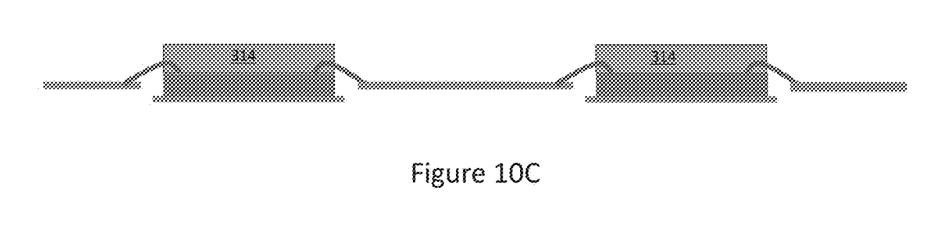

FIGS. 10A through 10C illustrate one embodiment of forming the second leadframe assembly 102 shown in FIGS. 1A and 1B.

In FIG. 10A, a second leadframe strip 300 is provided that includes a plurality of second die pads 302 and a plurality of second leads 304 interconnected to one another by a frame 306. Parts of the frame 306 are out-of-view in FIG. 10A. Each die pad 302 and the surrounding group of leads 304 forms a leadframe 308 which are interconnected by the frame 306 e.g. via tie bars or similar structures, as described above. Also in FIG. 10A, a second semiconductor die 310 is attached to each one of the second die pads 302 of the second leadframe strip 300. Any standard die attach process can be used such as soldering, sintering, gluing, etc.

In FIG. 10B, each one of the second semiconductor dies 310 is electrically connected to the group of second leads 304 that surrounds the second die pad 302 to which the die 310 is attached. For example, the second dies 212 can be connected to the corresponding groups of second leads 304 by electrical conductors 312 such as wire bonds, metal clips, metal ribbons, etc.

In FIG. 10C, a spacer 314 is applied to the exposed main surface of each second semiconductor die 310 of the second leadframe strip 300. As described previously herein, the spacer 314 is provided as structural support to enable die stacking prior to the molding process, and to ensure sufficient electrical isolation between the bond wire connections 214 of the first leadframe assemblies 216 and the bond wire connections 312 of the second leadframe strip 300. Preferably, but not necessarily, the spacer 314 is a good thermal conductor. Some examples of the spacer 314 are an adhesive or a polymeric glob, film or paste with thermally conductive and electrically insulative fillers. These are examples only, and should not be considered limiting.

The processing shown in FIGS. 9A through 9D and FIGS. 10A through 10C can be reversed, in that the second lead frame assembly 102 shown in FIGS. 1A and 1B can be processed as shown in FIGS. 9A through 9D and the first lead frame assembly 100 shown in FIGS. 1A and 1B can be processed as shown in FIGS. 10A through 10D. With this approach, a plurality of second lead frame assemblies would remain attached to one another as part of a single leadframe strip and a corresponding first leadframe strip would be singulated into individual first lead frame assemblies. In general, any of the QFN/DFN/QFP/DSO configurations shown in FIGS. 1A through 8 can be produced by the processing shown in FIGS. 9A through 9D and FIGS. 10A through 10C. In each case, one leadframe strip remains intact and the other leadframe strip is singulated into individual lead frame assemblies in preparation for subsequent processing that yields a plurality of package-in-package structures molded in a common process.

FIGS. 11A through 11E illustrate one embodiment of forming the molded semiconductor package shown in FIGS. 1A and 1B, by processing the first leadframe assemblies 216 and the second leadframe strip 300 realized by the processing shown in FIGS. 9A through 9D and FIGS. 10A through 10C, respectively. Again, as mentioned above, the processing illustrated in FIGS. 11A through 11E can be applied just as readily to any of the QFN/DFN/QFP/DSO configurations described herein.

Figure 11A:
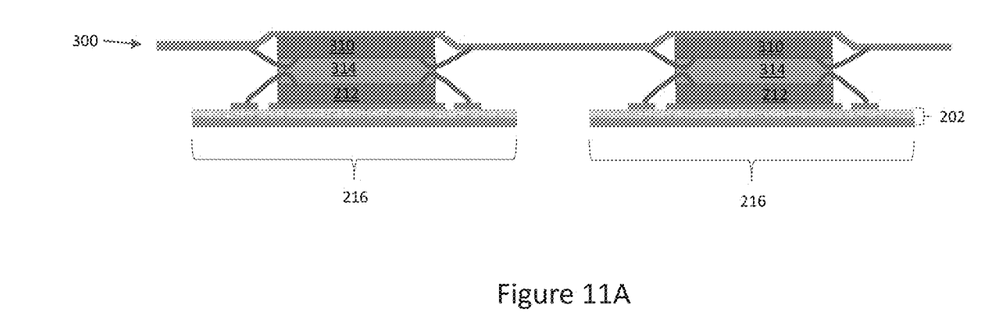

In FIG. 11A, after the spacer 314 is provided between the first leadframe assemblies 216 and the second leadframe strip 300, the second leadframe strip 300 is aligned with the first leadframe assemblies 216 so that each second semiconductor die 310 is disposed over one of the first semiconductor dies 212. The second semiconductor dies 310 may be vertically aligned or misaligned with the respective first semiconductor dies 212.

Figure 11B:
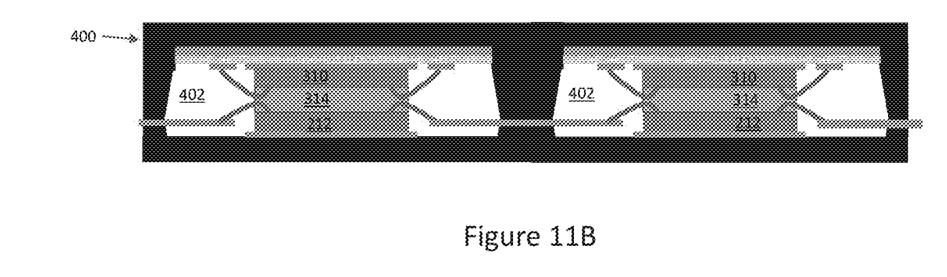

In FIG. 11B, the stacked arrangement of leadframe assemblies is placed in a standard molding tool 400 and subjected to a common molding process during which part of each first leadframe assembly 216, part of each second leadframe assembly attached to the intact leadframe strip 300, and the spacers 314 are embedded in a single mold compound 402. That is, the same mold compound 402 integrally embeds part of each first leadframe assembly 216, part of each second leadframe assembly attached to the intact leadframe strip 300 and the spacers 314. Hence, two separately molded packages are not stacked one on the other to form the resulting package-in-package structure. Instead, a single mold compound 402 having a contiguous construction throughout embeds the spacers 314 and partly embeds the leadframe assemblies in a common molding process. Any standard mold compound can be used.

Also in FIG. 11B, it is shown that the upper leadframe assemblies 216 are singulated in advance to allow the mold compound 402 to flow in and around the sides of the package-in-package structures being formed. Also, the bottom leadframe assemblies remain attached to on another in strip form to enable to the common molding process. That is, one group of the leadframe assemblies remain interconnected by a frame during the embedding with a single mold compound 402.

Figure 11C:
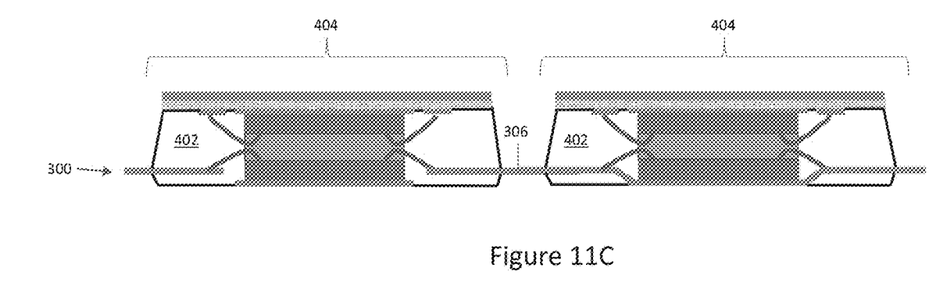

In FIG. 11C, the resulting molded package-in-package structures 404 are removed from the molding tool 400 and remain connected through the frame 306 of the lower leadframe strip 300.

Figure 11D:
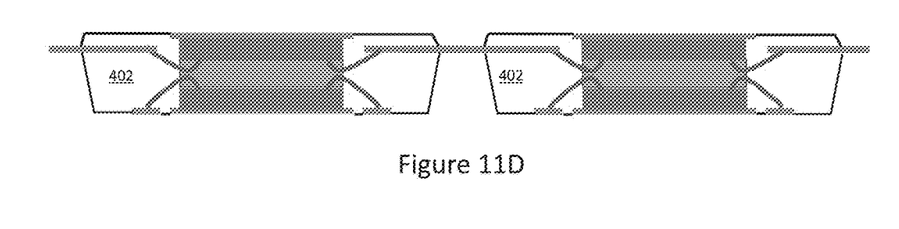

In FIG. 11D, the carrier 202 temporarily attached to the first leadframe assemblies 216 is removed after the embedding in the single mold compound 402. As described above, the carrier 202 provided support during the prior wire bond and common embedding processes. The carrier 202 can be re-used to provide support during a subsequent instance of manufacturing a new group of semiconductor packages.

Figure 11E:
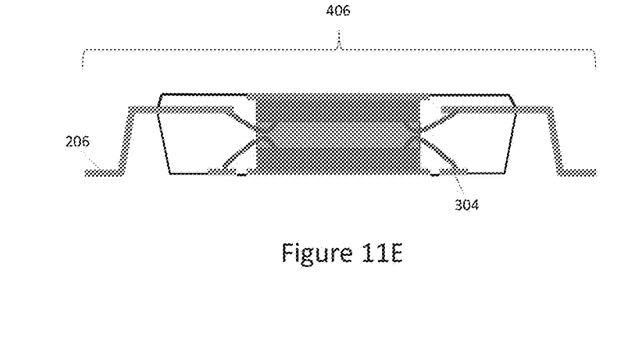

In FIG. 11E, the molded package-in-package structures 404 formed by the common molding process are singulated into individual packages 406. Any standard molded package singulation process can be used, such as trim and form, laser cutting, jet stream cutting, sawing, etc. The molded package-in-package structures 404 are singulated by cutting through the frame 306 that interconnects the lower leadframe assemblies. If mold compound 402 is formed on the section of the frame 306 to be cut, the mold compound 402 is also cut through in this region to singulate the molded package-in-package structures 404.

Also in FIG. 11E, the portion of each lead 206, 304 uncovered by the mold compound 402 can be de-flashed and plated in a common process step. Any standard de-flashing process can be used to remove burrs which occurred during the common molding process. Any standard plating process can be used to plate the exposed part of the leads 206, 304 e.g. with Sn, Sn alloy, NiPdAu, Ni alloy, Au, Au alloy, etc. Plating layer on the leads 206, 304 can comprise one or more metal layers, which use a non-oxidized metal or metal alloy material. The individual packages 406 also can be marked in a common process step.

Figure 12A:
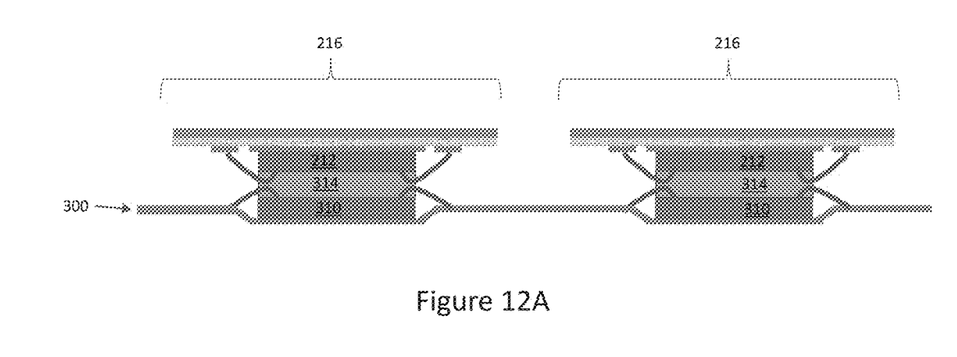
FIGS. 12A and 12B illustrate an alternative approach employed in manufacturing the molded semiconductor package.
Figure 12B:
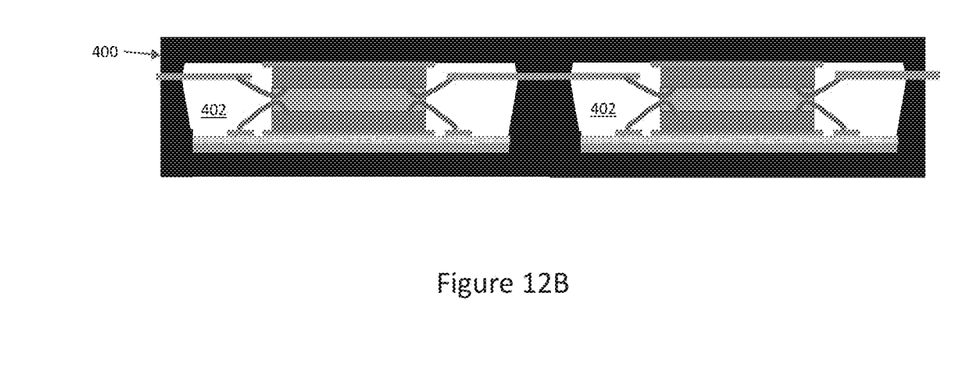

FIGS. 12A and 12B illustrate an alternate approach to the embodiment illustrated in FIGS. 11A and 11B. Instead of the QFN/DFN-based lead frame assemblies with the temporary carrier being disposed on the bottom of the stacked arrangement and the QFP/DSO-based leadframe strip being disposed on the top, the order is reversed. That is, the QFP/DSO-based leadframe strip is disposed on the bottom of the stacked arrangement and the QFN/DFN-based lead frame assemblies with the temporary carrier are disposed on the top of the stacked arrangement. The stacked arrangement is then inserted in a molding tool and subjected to a common molding process to embed part of each first leadframe assembly 216, part of each second leadframe assembly attached to the intact leadframe strip 300, and the spacers 314 in a single mold compound 402 as shown in FIG. 12B. The resulting molded arrangement of package-in-package structures can then be subjected to the common process steps shown in FIGS. 11O through 11E, for example.

As previously described herein, the terminals formed by the leads of the individual leadframe assemblies can have different configurations. For example, one group of leadframe assemblies can have a QFN or DFN configuration and the other group of leadframe assemblies can have a QFP or DSO configuration. In other cases, all leads can have the same configuration e.g. QFN, DFN, QFP or DSO.

Also as previously described herein, the dies included in one group of leadframe assemblies can be disposed over and vertically aligned with a corresponding semiconductor die included in the other group of leadframe assemblies. In other cases, the dies are vertically misaligned and/or one die is not disposed over the other. In each case, a spacer is provided as structural support to enable die stacking prior to the molding process and to ensure sufficient electrical isolation between the bond wire connections of the stacked leadframe assemblies.

Figure 13:
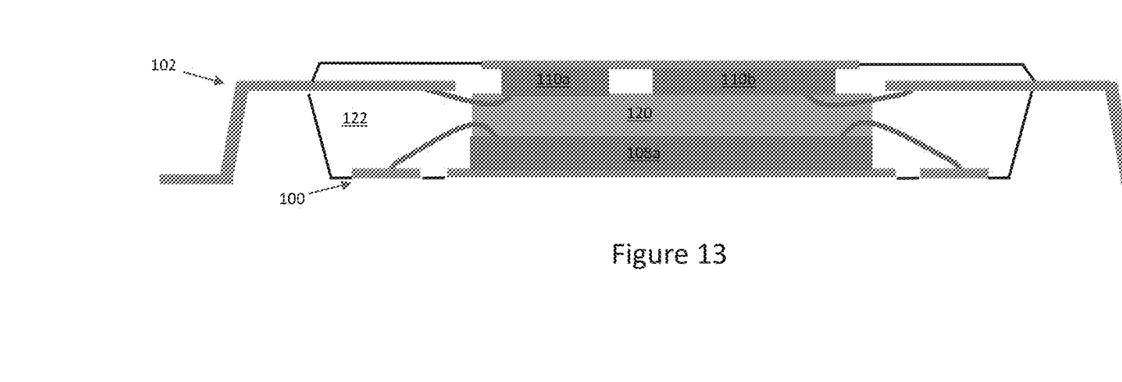

FIG. 13 illustrates another embodiment of the molded semiconductor package in which the lower leadframe assembly 100 includes a single semiconductor die 108a and the upper leadframe assembly 102 includes two semiconductor dies 110a, 110b, neither of which are vertically aligned with the single semiconductor die 108a of the lower leadframe assembly 100. The spacer 120 provides separation between both semiconductor dies 110a, 110b of the upper leadframe assembly 102 and the single semiconductor die 108a of the lower leadframe assembly 100. While the lower leadframe assembly 100 is shown with a QFN/DFN lead configuration and the upper leadframe assembly 102 is shown with a QFP/DSO lead configuration, the lead configurations can be reversed or even be the same.

Figure 14:
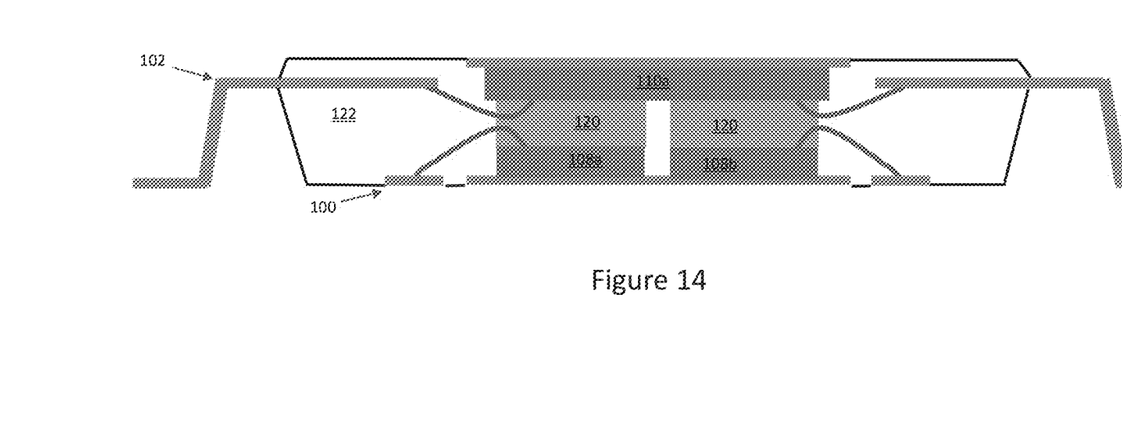

FIG. 14 illustrates yet another embodiment of the molded semiconductor package described above in connection with FIGS. 1A and 1B. The embodiment shown in FIG. 14 is similar to the embodiment illustrated in FIG. 13. Different, however, the upper leadframe assembly 102 includes a single semiconductor die 110a and the lower leadframe assembly 100 includes two semiconductor dies 108a, 108b, neither of which are vertically aligned with the semiconductor die 110a of the upper leadframe assembly 102. The spacer 120 again provides separation between both semiconductor dies 108a, 108b of the lower leadframe assembly 100 and the single semiconductor die 110a of the upper leadframe assembly 102. As explained above, while the lower leadframe assembly 100 is shown with a QFN/DFN lead configuration and the upper leadframe assembly 102 is shown with a QFP/DSO lead configuration, the lead configurations can be reversed or even be the same. Still other die/spacer configurations are also contemplated. In general, the spacer 120 is provided to separate the leadframe assemblies 100, 102 from one another and prevent bond wire shorting between the stacked leadframe assemblies 100, 102.

Figure 15:
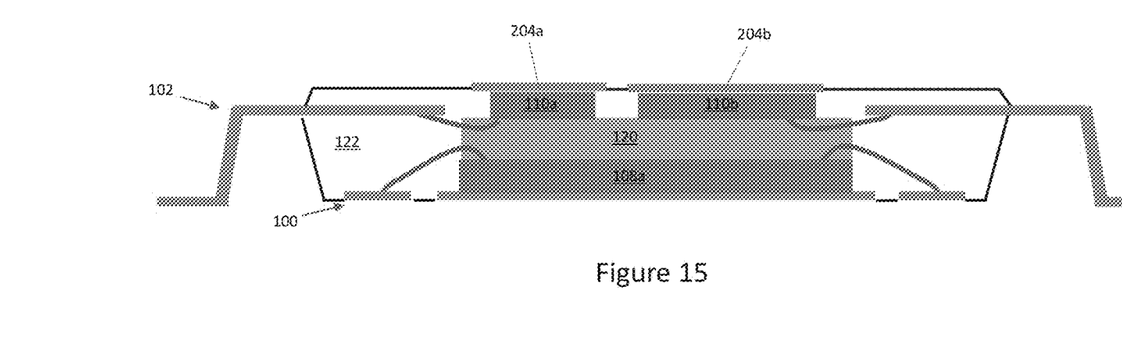

FIG. 15 illustrates still another embodiment of the molded semiconductor package. The embodiment shown in FIG. 15 is similar to the embodiment shown in FIG. 13. Different, however, semiconductor dies 110a, 110b are attached to separate die pads 204a, 204b.

Figure 16:
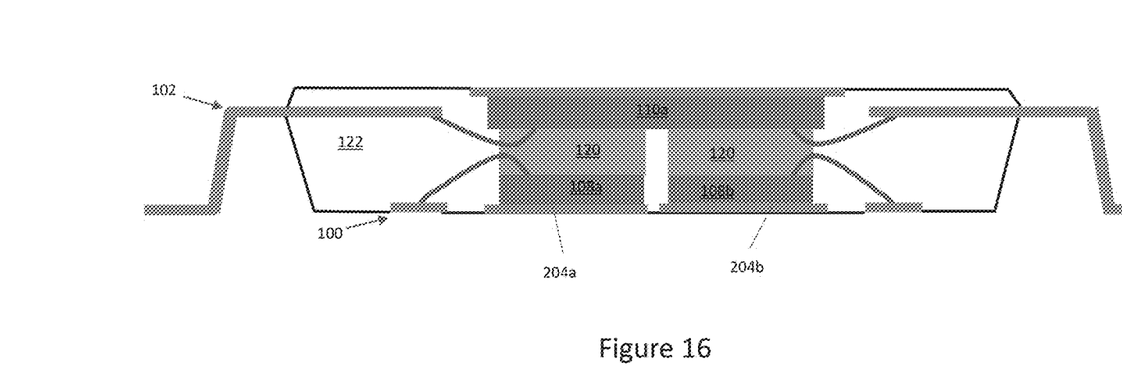

FIG. 16 illustrates another embodiment of the molded semiconductor package. The embodiment shown in FIG. 15 is similar to the embodiment shown in FIG. 14. Different, however, semiconductor dies 110a, 110b are attached to separate die pads 204a, 204b.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing semiconductor packages, the method comprising:
   providing a plurality of first leadframe assemblies each of which includes a first die pad, a first plurality of leads, and a first semiconductor die attached to the first die pad and electrically connected to the first plurality of leads;
   stacking a plurality of second leadframe assemblies above each of the first leadframe assemblies, each second leadframe assembly comprising a second die pad, a second plurality of leads, and a second semiconductor die attached to the second die pad and electrically connected to the second plurality of leads;
   providing an electrically insulative spacer between the first leadframe assemblies and the second leadframe assemblies;
   embedding part of each first leadframe assembly, part of each second leadframe assembly and each electrically insulative spacer in a single mold compound, so that a portion of each first plurality of leads and a portion of each second plurality of leads are uncovered by the mold compound to form terminals of respective semiconductor packages, and so that a side of each first die pad facing away from the adjacent first semiconductor die and a side of each second die pad facing away from the adjacent second semiconductor die are uncovered by the mold compound; and
   singulating the respective semiconductor packages into individual packages.

2. The method of claim 1, wherein the first leadframe assemblies or the second leadframe assemblies remain interconnected by a frame during the embedding with the mold compound.

3. The method of claim 2, further comprising:
   cutting through the frame to singulate the respective semiconductor packages into the individual packages.

4. The method of claim 1, further comprising:
   temporarily attaching the first leadframe assemblies or the second leadframe assemblies to a carrier that provides support during the embedding with the mold compound; and
   removing the carrier after the embedding.

5. The method of claim 4, further comprising:
   re-using the carrier to provide support during a subsequent instance of manufacturing a new group of semiconductor packages.

6. The method of claim 1, further comprising:
   de-flashing and plating the portion of each first plurality of leads and the portion of each second plurality of leads uncovered by the mold compound, in a common process step.

7. The method of claim 1, further comprising:
   marking the individual packages, in a common process step.

8. The method of claim 1, wherein stacking a second leadframe assembly above each of the first leadframe assemblies comprises:
   providing a leadframe strip that includes the first die pads interconnected to one another by a frame;
   attaching a first semiconductor die to each one of the first die pads;
   electrically connecting each one of the first semiconductor dies to the first plurality of leads surrounding the first die pad to which the first semiconductor die is attached; and
   after providing the electrically insulative spacer between the first leadframe assemblies and the second leadframe assemblies, aligning the leadframe strip with the plurality of second leadframe assemblies so that each second semiconductor die is disposed over one of the first semiconductor dies.

9. The method of claim 8, wherein the first leadframe assemblies have a quad-flat no-leads (QFN) or a dual-flat no-leads (DFN) configuration, and wherein the second leadframe assemblies have a quad flat package (QFP) or a dual small outline package (DSO) configuration.

10. The method of claim 1, wherein the electrically insulative spacer is an adhesive.

11. The method of claim 1, wherein the electrically insulative spacer comprises a polymeric glob, film or paste with thermally conductive and electrically insulative fillers.

12. The method of claim 1, wherein after stacking the plurality of second leadframe assemblies, the second semiconductor dies are disposed over and vertically aligned with the first semiconductor dies and the electrically insulative spacer is interposed between the second semiconductor dies and the first semiconductor dies.

* * * * *